United States Patent
Chiu et al.

(10) Patent No.: US 11,215,676 B2
(45) Date of Patent: Jan. 4, 2022

(54) POWER CIRCUIT AND DETECTION CIRCUIT THEREOF

(71) Applicant: SITRONIX TECHNOLOGY CORP., Jhubei (TW)

(72) Inventors: Ta-Hung Chiu, Jhubei (TW); Mao-Hsiang Yeh, Jhubei (TW)

(73) Assignee: Forcelead Technology Corp., Jhubei (TW)

( * ) Notice: Subject to any disclaimer, the term of this patent is extended or adjusted under 35 U.S.C. 154(b) by 0 days.

(21) Appl. No.: 16/733,807

(22) Filed: Jan. 3, 2020

(65) Prior Publication Data

US 2020/0386826 A1 Dec. 10, 2020

Related U.S. Application Data

(60) Provisional application No. 62/787,824, filed on Jan. 3, 2019.

(51) Int. Cl.
| | | |
|---|---|---|
| *G01R 31/40* | (2020.01) | |
| *G01R 19/00* | (2006.01) | |
| *H02M 1/32* | (2007.01) | |

(52) U.S. Cl.
CPC ......... *G01R 31/40* (2013.01); *G01R 19/0069* (2013.01); *G01R 19/0084* (2013.01); *H02M 1/32* (2013.01)

(58) Field of Classification Search
None
See application file for complete search history.

(56) References Cited

U.S. PATENT DOCUMENTS

| | | |
|---|---|---|
| 4,837,519 A | 6/1989 | Lopetrone et al. |
| 5,729,145 A | 3/1998 | Blades |
| 2013/0193981 A1* | 8/2013 | Chen ................ G01R 19/16552 324/537 |

(Continued)

FOREIGN PATENT DOCUMENTS

| | | |
|---|---|---|
| TW | 201206039 A1 | 2/2012 |
| TW | 201512679 A | 4/2015 |
| TW | 201603456 A | 1/2016 |

(Continued)

OTHER PUBLICATIONS

Communication Fro the Taiwan Patent Office dated (Taiwan Year 109) Oct. 31, 2020.

*Primary Examiner* — Jas A Sanghera
(74) *Attorney, Agent, or Firm* — Rosenberg, Klein & Lee

(57) ABSTRACT

The present invention relates to a power circuit, which comprises a detection circuit. The detection circuit includes an abnormality detection circuit. The abnormality detection circuit is coupled to an input terminal or/and an output terminal of the power circuit. An input power is provided to the input terminal, and an output power is provided to the output terminal. The abnormality detection circuit controls the paths from a plurality of energy storage elements to the input terminal and the output terminal of the power circuit. The energy storage elements store the energy of the input power to generate the output power. The abnormality detection circuit detects the state of the input power or/and the output power, and cuts off the paths from a portion of the energy storage elements to the input terminal and the output terminal.

33 Claims, 10 Drawing Sheets

(56) References Cited

U.S. PATENT DOCUMENTS

2016/0241134 A1    8/2016  Maruyama
2016/0261205 A1*   9/2016  Kolar .................. H02M 1/32

FOREIGN PATENT DOCUMENTS

| TW | 201629499 A | 8/2016 |
| TW | 201633679 A | 9/2016 |
| TW | 201639286 A | 11/2016 |
| TW | 201805642 A | 2/2018 |

* cited by examiner

POWER CIRCUIT AND DETECTION CIRCUIT THEREOF

FIELD OF THE INVENTION

The present invention relates generally to a power circuit and the detection circuit thereof, and particularly to a power circuit and the detection circuit thereof capable of detecting the energy storage elements being normal or abnormal.

BACKGROUND OF THE INVENTION

All electronic products need power circuits to supply power. A general power circuit receives an input power for generating and supplying various output power to the circuits requiring power. The power circuit comprises a low dropout regulator (LDO), a DC to DC circuit, an AC to DC circuit, or a switching power circuit. The switching power circuit comprises a switching capacitor circuit.

Unfortunately, in the application of the switching capacitor circuit, capacitors might be damaged, making the output power of the loading requirements not satisfied. Accordingly, the present invention provides a power circuit and the detection circuit thereof for detecting the energy storage elements being normal or abnormal in the power circuit.

SUMMARY

An objective of the present invention is to provide a detection circuit of a power circuit capable of detecting the energy storage elements of the power circuit being normal or abnormal.

Another objective of the present invention is to provide a power circuit, which comprises an isolation terminal used for achieving the purpose of isolating the energy storage elements being defective.

The present invention relates to a detection circuit of a power circuit. The detection circuit includes an abnormality detection circuit. The abnormality detection circuit is coupled to an input terminal or/and an output terminal of the power circuit. An input power is provided to the input terminal, and an output power is provided to the output terminal. The abnormality detection circuit controls the paths from a plurality of energy storage elements to the input terminal and the output terminal of the power circuit. The energy storage elements store the energy of the input power to generate the output power. The abnormality detection circuit detects the state of the input power or/and the output power, and cuts off the paths from a portion of the energy storage elements to the input terminal and the output terminal. In addition, the abnormality detection circuit may switch off and switch on the paths from the energy storage elements to the input terminal and the output terminal.

The present invention relates to a power circuit, which comprises a plurality of energy storage elements, a plurality of switching circuits, and an abnormality detection circuit. The energy storage elements store the energy of an input power for generating the output power. The switching circuits are coupled to the energy storage elements, an input terminal, an output terminal, and an isolation terminal. The input power is supplied to the input terminal; the output power is supplied to the output terminal. The switching circuits switch the paths from the energy storage elements to the input terminal, the output terminal, and the isolation terminal. The abnormality detection circuit detects the state of the input power or/and the output power, and controls the switching circuits to switch the paths from the energy storage elements to the input terminal, the output terminal, and the isolation terminal.

DETAILED DESCRIPTION

In the specifications and subsequent claims, certain words are used for representing specific devices. A person having ordinary skill in the art should know that hardware manufacturers might use different nouns to call the same device. In the specifications and subsequent claims, the differences in names are not used for distinguishing devices. Instead, the differences in functions are the guidelines for distinguishing. In the whole specifications and subsequent claims, the word "comprising" is an open language and should be explained as "comprising but not limited to". Besides, the word "couple" includes any direct and indirect electrical connection. Thereby, if the description is that a first device is coupled to a second device, it means that the first device is connected electrically to the second device directly, or the first device is connected electrically to the second device via other device or connecting means indirectly.

Figure 1:
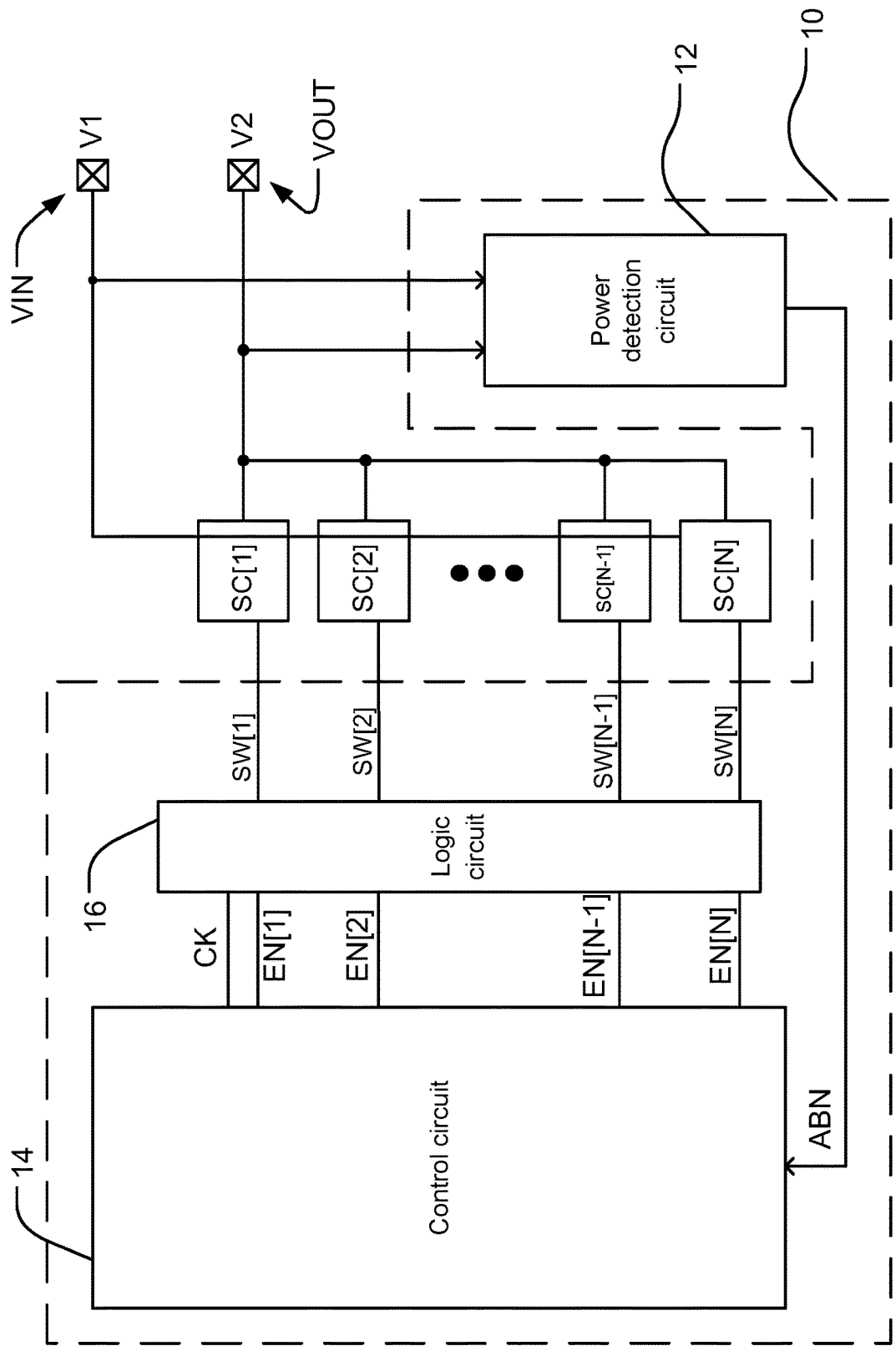
FIG. 1 shows a circuit diagram of the detection circuit of the power circuit according to the first embodiment of the present invention.
Figure 2:
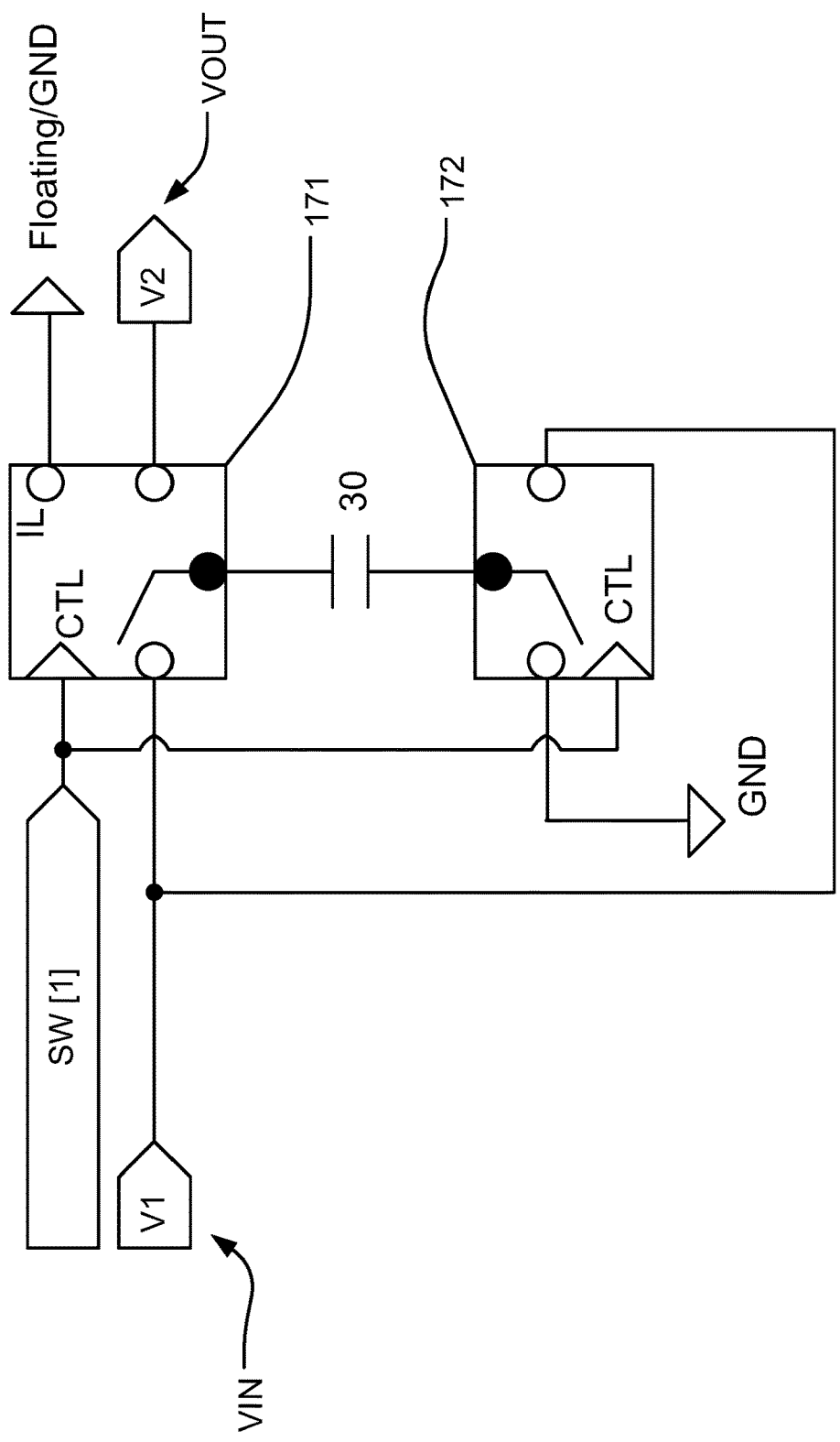
FIG. 2 shows a circuit diagram of the energy storage circuit according to the first embodiment of the present invention.

Please refer to FIG. 1, which shows a circuit diagram of the detection circuit of the power circuit according to the first embodiment of the present invention. As shown in the figure, the power circuit comprises a detection circuit, which comprises an abnormality detection circuit 10 for detecting multiple items such as detecting the operations of the energy storage elements being normal or abnormal, detecting an over voltage, or/and detecting an over current. The abnormality detection circuit 10 is coupled to an input terminal VIN or/and an output terminal VOUT of the power circuit. An input power V1 is supplied to the input terminal VIN and an output power V2 is supplied to the output terminal VOUT. A plurality of energy storage circuits SC[1], SC[2] ... SC[N−1], SC[N] are coupled to the input terminal VIN for receiving the input power V1, storing the energy of the input power V1, and generating the output power V2 to the output terminal VOUT. The energy storage circuits SC[1:N] may include a plurality of energy storage elements 30, as shown in FIG. 2. The energy storage elements 30 may be, for example, a capacitor or an inductor. The abnormality detection circuit 10 may control the paths from the energy storage circuits SC[1:N] to the input terminal VIN and the output terminal VOUT. Thereby, the abnormality detection circuit 10 detects the state of the input power V1 or/and the output power V2. By switching off the paths from the energy storage circuits SC[1:N] to the input terminal VIN or/and the output terminal VOUT, abnormality or normality of the energy storage circuits SC[1:N] may be detected. Furthermore, the abnormal one among the energy storage circuits SC[1:N] may be detected as well.

In other words, the abnormality detection circuit 10 may control the paths from the energy storage elements 30 to the input terminal VIN and the output terminal VOUT. Thereby, the abnormality detection circuit 10 detects the state of the input power V1 or/and the output power V2. By switching off the paths from the energy storage elements 30 to the input terminal VIN or/and the output terminal VOUT, it may be detected if the energy storage elements 30 are normal. Furthermore, the abnormal one among the energy storage elements 30 may be detected as well.

Please refer again to FIG. 1. The input power V1 is charged to the energy storage elements 30 of the energy storage circuits SC[1:N]. The energy storage elements 30 store the energy of the input power V1 for generating the output power V2. Thereby, when the input power V1 is abnormal and the energy storage elements 30 are not failed and are normal elements, the state of the output power V2 will be an abnormal power state. The abnormal power state as described above may be, for example, low voltage. When the state of the input power V1 is a normal power state and one or more of the energy storage elements 30 is defective to be abnormal element, the state of the output power V2 is still the abnormal power state. Thereby, by detecting the input power V1 and controlling the paths from the energy storage elements 30 to the input terminal VIN or/and the output terminal VOUT, the abnormality detection circuit 10 may detect if the input power V1 and the energy storage elements 30 comply with the requirements for normally supplying power. When the abnormality detection circuit 10 detects that the input power V1 or/and the output power V2 are in the abnormal power state, the abnormality detection circuit 10 starts an exception detection. According to the embodiment of FIG. 1, the abnormality circuit 10 switches off the paths from a portion of the energy storage elements 30 to the input terminal VIN and the output terminal VOUT. The abnormality circuit 10 also controls the input power V1 to charge the other energy storage elements 30 of the energy storage elements 30. At this moment, the abnormality detection circuit 10 detects if the state of input power V1 and/or the state of output power V2 have recovered to the normal power state.

When one of the energy storage elements 30 is failed and becomes an abnormal device, the fail energy storage element will form a discharge path. Thereby, the input power V1 or/and the output power V2 will be discharged via the discharge path and their voltage levels will be lowered. Contrarily, when the energy storage elements 30 are not failed and remain normal, no discharge path is formed. Then the voltage levels of the input power V1 and the output power V2 are normal. Thereby, if the states of the input power V1 and the output power V2 are recovered to the normal power state after switching off the paths from a portion of the energy storage elements 30 to the input terminal VIN and the output terminal VOUT, it means that the portion of the energy storage elements 30 are failed to be abnormal elements. If the states of the input power V1 and the output power V2 are not recovered to the normal power state after respectively switching off the paths from each energy storage elements 30 to the input terminal VIN and the output terminal VOUT, it means that the energy storage elements 30 are not failed and are normal elements. It also means that the state of the input power V1 or the output power V2 is the abnormal power state.

The abnormality detection circuit 10 comprises a power detection circuit 12, which may be coupled to the input terminal VIN or/and the output terminal VOUT for detecting the input power V1 or/and the output power V2. Thereby, the power detection circuit 12 detects the voltage levels of the input power V1 or/and the output power V2 for generating a detection signal ABN. In other words, the power detection circuit 12 detects whether the voltage levels of the input power V1 or/and the output power V2 are lower or higher than a first reference voltage, as the VREF1 shown in FIG. 4. When the voltage level of the input power V1 is lower than the voltage level of the first reference voltage VREF1, it means that the input power V1 is in the abnormal power state. When the voltage level of the output power V2 is lower than the voltage level of the first reference voltage VREF1, it means that the output power V2 is in the abnormal power state. When the voltage level of the input power V1 is higher than the voltage level of the first reference voltage VREF1, it means that the input power V1 is in the normal power state. When the voltage level of the output power V2 is higher than the voltage level of the first reference voltage VREF1, it means that the output power V2 is in the normal power state. According to an embodiment of the present invention, the high and low levels of the detection signal ABN represent abnormal and normal power states, respectively. Likewise, the high and low levels of the detection signal ABN may represent normal and abnormal power states, respectively. That is to say, the levels of the detection signal ABN according the embodiment correspond to circuit designs. The states represented by the levels are not limited to the present embodiment.

The abnormality detection circuit 10 comprises a control circuit 14, which is coupled to the power detection circuit 12 and generates a plurality of enable signals EN[1], EN[2] ... EN[N−1], EN[N] according to the detection signal ABN for controlling the operations of the energy storage circuits SC[1:N], respectively. In other words, the control circuit 14 controls each energy storage element 30 to couple to the input terminal VIN for charging or to the output terminal VOUT for discharging, respectively. Alternatively, the control circuit 14 controls the energy storage elements 30 not to coupled to the input terminal VIN and the output terminal VOUT, meaning switching off the paths from the energy storage elements 30 to the input terminal VIN and the output terminal VOUT. Further, the control circuit 14 generates a clock signal CK, the frequency of the clock signal CK determines the frequency of switching to the input terminal VIN and the output terminal VOUT, which means the frequency of charging and discharging of the energy storage element 30.

There are different methods for detecting the energy storage elements 30 are normal or abnormal element. For example, when the power detection circuit 12 only detects the state of the input power V1 and the state is abnormal power state, the control circuit 14 switches off the path between one or more energy storage element 30 and the input terminal VIN according to the detection signal ABN. Alternatively, when the power detection circuit 12 only detects the state of the output power V2 and the state is abnormal power state, the control circuit 14 switches off the path between one or more energy storage element 30 and the out terminal VOUT according to the detection signal ABN. Alternatively, when the power detection circuit 12 detects the states of the input power V1 and the output power V2 and the states are both abnormal power state, the control circuit 14 switches off the paths from one or more energy storage element 30 to the input terminal VIN and the output terminal VOUT according to the detection signal ABN. For example, the abnormality detection circuit 10 generates the enable signal EN[1] for switching off the paths from the first energy storage element 30 to the input terminal VIN and the output terminal VOUT. In addition, the abnormality detection circuit 10 also generates the enable signals EN[2] . . . EN[N−1], EN[N] for controlling the other energy storage elements 30 to switch to the input terminal VIN and the output terminal VOUT for normal charging and discharging operations to generate the output power V2.

The abnormality detection circuit 10 comprises a logic circuit 16, which is coupled to the control circuit 14 and the energy storage circuits SC[1:N]. According to the embodiment of FIG. 1, the logic circuit 16 controls the operation of the energy storage circuits SC[1:N] according to the enable signals EN[1]~EN[N]. Like the previous description, the logic circuit 16 may control the energy storage circuits SC[1:N] to switch to the input terminal VIN and the output terminal VOUT normally or to switch off the paths from a portion of the energy storage circuits SC[1:N] to the input terminal VIN and the output terminal VOUT. In other words, the logic circuit 16 switches off the paths from a portion of the energy storage elements 30 to the input terminal VIN and the output terminal VOUT. The logic circuit 16 controls a portion of the energy storage elements 30 according to the enable signals EN[1]~EN[N] to stop charging and discharging and controls the other energy storage elements 30 to switch to the input terminal VIN and the output terminal VOUT for normal charging or discharging to generate the output power V2. Thereby, when the other energy storage elements 30 perform charging and discharging to generate the output power V2, the power detection circuit 12 detects if the voltage level of the input power V1 and the output power V2 are higher than the voltage level of the first reference voltage VREF1. After controlling a portion of the energy storage elements 30 not to couple to the input terminal VIN and the output terminal VOUT, if the voltage levels of the input power V1 and the output power V2 change from being lower than the first reference voltage VREF1 to being higher, it means that the portion of the energy storage elements 30 are failed to be abnormal elements.

The power detection circuit 12 according to the above embodiment uses the first reference voltage VREF1 as the reference for detecting the input power V1 and the output power V2. Nonetheless, when the voltage levels of the input power V1 and the output power V2 are different, the first reference voltage VREF1 and a second reference voltage VREF2 may be used to detect the states of the input power V1 and the output power V2, respectively.

Furthermore, the logic circuit 16 may include a plurality of logic gates such as AND gates. A plurality of input terminals of the logic gates receive the enable signals EN[1]~EN[N] and the clock signal CK, respectively, and generate a plurality of switching signals SW[1], SW[2] . . . SW[N−1], SW[N] at the output terminals of the logic gates for controlling the energy storage circuits SC[1:N], respectively. For example, the logic circuit 16 generates the switching signal SW[1] according to the enable signal EN[1] and the clock signal CK for controlling the first energy storage circuit SC[1]. Then the first enable signal EN[1] controls the operation of the first energy storage element 30 of the first energy storage circuit SC[1]. For example, when the detection signal ABN represents that the states of input power V1 and the output power V2 to be abnormal power state, the control circuit 14 generates the enable signal EN[1], which is a low voltage level, according to the detection signal ABN and an internal control logic. Thereby, the logic circuit 16 generates the switching signal SW[1] according to the enable signal EN[1]. The switching signal SW[1] switches off the path from the energy storage element 30 of the first energy storage circuit SC[1] to the input terminal VIN and the output terminal VOUT for controlling the energy storage element 30 of the first energy storage circuit SC[1] not to switch to the input terminal VIN and the output terminal VOUT.

At this moment, the level of the enable signal EN[1] is low. The level of the switching signal SW[1] generated by the logic circuit 16 according to the enable signal EN[1] is low. That is to say, unlike the clock signal CK with continuous pulses, the switching signal SW[1] generated by the logic circuit 16 will not control the energy storage element 30 of the first energy storage circuit SC[1] to perform charging and discharging. The low-level enable signal EN[1] stops the clock signal CK from controlling the energy storage element 30 of the first energy storage circuit SC[1] to perform charging and discharging. When the level of the enable signal EN[1] is low, the waveform of the switching signal SW[1] may be identical to the waveform of the enable signal EN[1]. When the level of the enable signal EN[1] is high, the waveform of the switching signal SW[1] may be similar to the waveform of the clock signal CK for controlling the energy storage element 30 of the first energy storage circuit SC[1] to switch to the input terminal VIN and the output terminal VOUT for charging and discharging. Nonetheless, owing to the circuit design, when the level of the enable signal EN[1] is low, the logic circuit 16 may generate a high-level switching signal SW[1]. Namely, the waveform of the switching signal SW[1] may be different from the waveform of the enable signal EN[1] but still controlling the energy storage element 30 of the first energy storage circuit SC[1] not to switch to the input terminal VIN and the output terminal VOUT. Likewise, when the level of the enable signal EN[1] is high, the waveform of the switching signal SW[1] may be different from the waveform of the clock signal CK. The design is optional according to embodiments.

Besides, according to the present embodiment, the number of the portion of energy storage elements 30 as described is not limited to 1, 2, or 3 . . . . Alternatively, the portion of energy storage elements 30 may be discontinuous elements. Namely, the portion of energy storage elements 30 may be the odd or even numbered energy storage elements 30. Thereby, the present embodiment does not limit the location or number of the portion of energy storage elements 30 switched off by the abnormality detection circuit 10. Moreover, the logic circuit 16 may be integrated in the control circuit 14, meaning that the control circuit 14 may output the switching signals SW[1], SW[2] . . . SW[N−1], SW[N] directly.

Please refer to FIG. 2, which shows a circuit diagram of the energy storage circuit according to the first embodiment of the present invention. The present embodiment uses the first energy storage circuit SC[1] as an example for explanation. As shown in the figure, the first energy storage circuit SC[1] includes a plurality of switching circuits 171, 172 and an energy storage element 30. The switching circuit 171 is coupled to an isolation terminal IL, a first terminal of the energy storage element 30, the input terminal VIN, and the output terminal VOUT. The switching circuit 172 is coupled to a second terminal of the energy storage element 30, the input terminal VIN, and a reference terminal GND. According to an embodiment of the present invention, the reference terminal GND is the ground. In addition, the isolation terminal IL may be the reference terminal GND or in a floating state. Thereby, the abnormality detection circuit 10 controls the switching circuits 171, 172 to switch the path between the first terminal of the energy storage element 30 and the input terminal VIN, the path between the first terminal of the energy storage element 30 and the output terminal VOUT, the path between the second terminal of the energy storage element 30 and the input terminal VIN, and the path between the second terminal of the energy storage element 30 and the reference terminal GND. In other words, the abnormality detection circuit 10 controls the switching circuits 171, 172 to switch the first terminal of the energy storage element 30 to the input terminal VIN or the output terminal VOUT and switch the second terminal of the energy storage element 30 to the input terminal VIN or the reference terminal GND for performing charging and discharging to generate the output power V2. Besides, the abnormality detection circuit 10 controls the switching circuit 171 to switch the path between the first terminal of the energy storage element 30 and the isolation terminal IL for controlling the first terminal of the energy storage element 30 to coupled to the isolation terminal IL. Namely, the paths from the energy storage element 30 to the input terminal VIN and the output terminal VOUT are switched off for not generating the output power V2.

The control terminals CTL of the switching circuits 171, 172 are coupled to the output terminal of the logic circuit 16 for receiving the switching signal SW[1]. The switching signal SW[1] controls the switching circuits 171, 172 for switching the paths from the energy storage element 30 to the input terminal VIN, the output terminal VOUT, the isolation terminal IL, and the reference terminal GND. When the abnormality detection circuit 10 controls the energy storage element 30 to charge, the abnormality detection circuit 10 controls the switching circuit 171 to switch to the left side in the figure and enabling the first terminal of the energy storage element 30 to coupled to the input terminal VIN. The abnormality detection circuit 10 also controls the switching circuit 172 to switch to the left side in the figure and enabling the second terminal of the energy storage element 30 to couple to the reference terminal GND. As the abnormality detection circuit 10 controls the energy storage element 30 to discharge, the abnormality detection circuit 10 controls the switching circuit 171 to switch to the right side in the figure and enabling the first terminal of the energy storage element 30 to coupled to the output terminal VOUT. The abnormality detection circuit 10 also controls the switching circuit 172 to switch to the left side in the figure and enabling the second terminal of the energy storage element 30 to couple to the reference terminal GND. Thereby, the output power V2 equal to the input power V1 may be provided. Alternatively, the abnormality detection circuit 10 controls the switching circuit 172 to switch to the right side in the figure and enabling the second terminal of the energy storage element 30 to couple to the input terminal VIN for providing the output power V2 having twice the voltage of the input power V1.

According to the present embodiment, when the power detection circuit 12 detects that the states of input power V1 and the output power V2 are abnormal power state and then detects the energy storage element 30 in FIG. 2 is normal or abnormal element, the abnormality detection circuit 10 may switch off the path from the energy storage element 30 in FIG. 2 to the input terminal VIN and the output terminal VOUT. Namely, the switching circuits 171, 172 are switched to the isolation terminal IL and the reference terminal GND, respectively. Then the energy storage element 30 will not be coupled to the input terminal VIN and the output terminal VOUT for isolating the energy storage element 30 in FIG. 2. Thereby, the input power V1 charges the other energy storage elements 30 coupled to the input terminal VIN, for example, the energy storage elements 30 of the second to the N-th energy storage circuits SC[2]~SC[N]. Then the other energy storage elements 30 discharge to generate the output power V2. During the charging and discharging process of the other energy storage elements 30, the power detection circuit 12 continues to detect if the states of the input power V1 and the output power V2 have changed from abnormal to normal power states. If the energy storage element 30 in FIG. 2 is abnormal element and is isolated, the voltage level of the input power V1 will be increased. In other words, the state of the input power V1 will recover to the normal power state gradually. In addition, the voltage level of the output power V2 will be increased as well, meaning that the state of the output power V2 will recover to the normal power state gradually. If the energy storage 30 in FIG. 2 is isolated and the states of the input power V1 and the output power V2 have not recovered to the normal power state, it means that the energy storage 30 in FIG. 2 is not the abnormal element. Then the abnormality detection circuit 10 controls the switching circuit 171, 172 to couple the energy storage 30 in FIG. 2 to the input terminal VIN or the output terminal VOUT for charging and discharging to generate the output power V2.

The same detection is performed continuously for switching off the paths from the energy storage elements 30 of each energy storage circuit SC[1:N] to the input terminal VIN and the output terminal VOUT sequentially to isolate the energy storage elements 30 of each energy storage circuit SC[1:N] sequentially for finding out all abnormality energy storage elements 30. Contrarily, after the abnormality detection circuit 10 switches off the paths from the energy storage elements 30 of each energy storage circuit SC[1:N] to the input terminal VIN and the output terminal VOUT sequentially, namely, after the abnormality detection circuit 10 isolates the energy storage elements 30 of each energy storage circuit SC[1:N] sequentially, if the states of the input power V1 or the output power V2 are still abnormal power state, it means that the input power V1 or the load is abnormal, resulting in the output power V2 to be abnormal power state. It is not one of the energy storage elements 30 causing the state of the input power V1 or the output power V2 abnormal. Accordingly, the present invention may detect if the states of the input power V1 and the output power V2 are abnormal, instead of merely the failed energy storage elements 30.

In the following, the process of the abnormality detection circuit 10 detecting the energy storage elements 30 of the energy storage circuits SC[1:N] being normal or abnormal element will be described in detail. The abnormality detection circuit 10 may first switch off the paths from the energy storage element 30 of the first energy storage circuit SC[1] to the input terminal VIN and the output terminal VOUT and switch on the paths from the energy storage elements 30 of the second to the N-th energy storage circuits SC[2]~SC[N] to the input terminal VIN and the output terminal VOUT. In addition, when the first energy storage element 30 is detected to be normal element, the paths from the energy storage elements 30 of the first energy storage circuit SC[1] and the energy storage elements 30 of the third to the N-th energy storage circuits SC[3]~SC[N] to the input terminal VIN and the output terminal VOUT are switched on, and the paths from the energy storage element 30 of the second energy storage circuit SC[2] to the input terminal VIN and the output terminal VOUT are switched off. Afterwards, the paths from the energy storage elements 30 of the first to the second energy storage circuits SC[1]~SC[2] and the energy storage elements 30 of the fourth to the N-th energy storage circuits SC[4]~SC[N] to the input terminal VIN and the output terminal VOUT are switched on; the paths from the energy storage element 30 of the third energy storage circuit SC[3] to the input terminal VIN and the output terminal VOUT are switched off. If the energy storage element 30 detected is abnormal element, the paths from this abnormal energy storage element 30 to the input terminal VIN and the output terminal VOUT will no longer be switched on.

Figure 3:
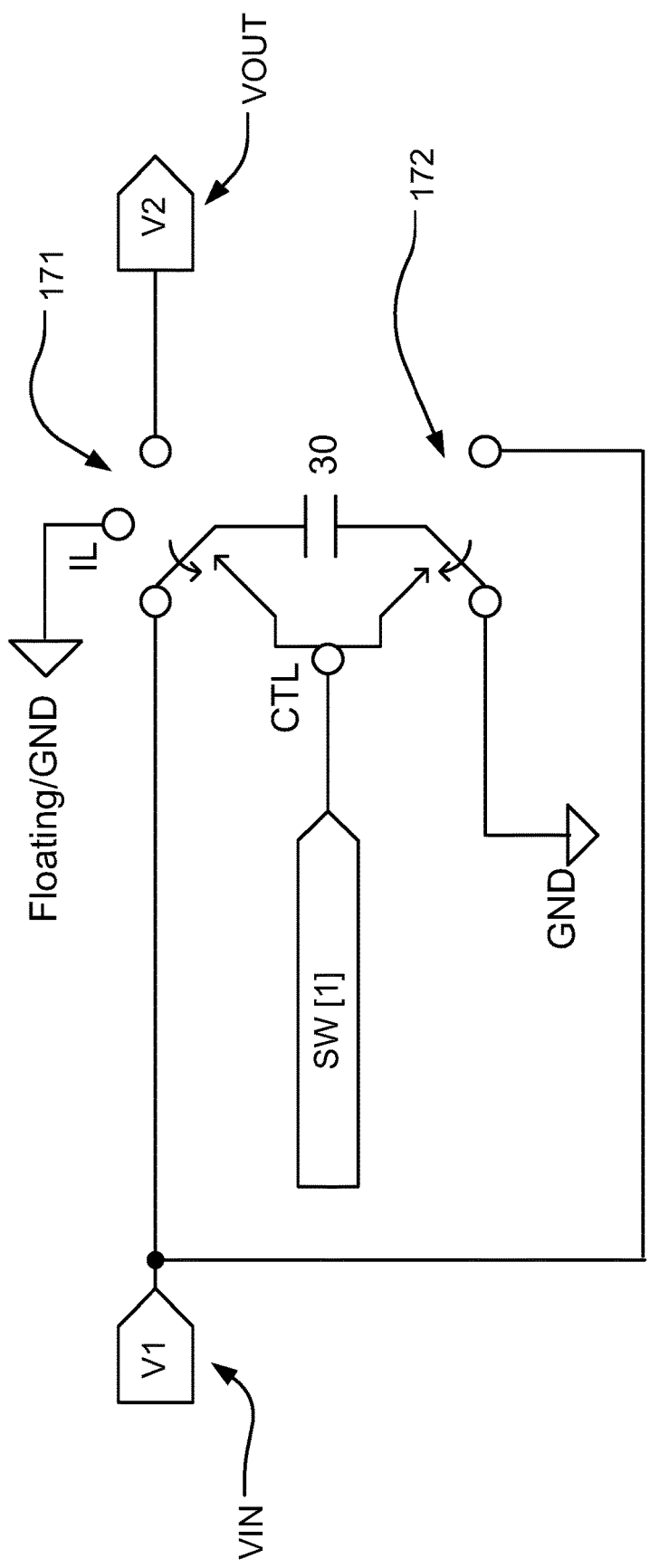
FIG. 3 shows a circuit diagram of the switching circuit according to the first embodiment of the present invention.

Please refer to FIG. 3, which shows a circuit diagram of the switching circuit according to the first embodiment of the present invention. As shown in the figure, the switching circuits 171, 172 may be switches capable of selectively coupling the energy storage element 30 between the input terminal VIN and the reference terminal GND or between the output terminal VOUT and the input terminal VIN for performing charging and discharging operations. Alternatively, the switching circuits 171, 172 may couple the energy storage element 30 between the isolation terminal IL and the reference terminal GND for isolating the energy storage element 30. In other words, the switching circuit 171 includes a plurality of terminals for coupling to the input terminal VIN, the output terminal VOUT, and the isolation terminal IL. The switching circuit 172 also includes a plurality of terminals for coupling to the reference terminal GND and the input terminal VIN.

Figure 4:
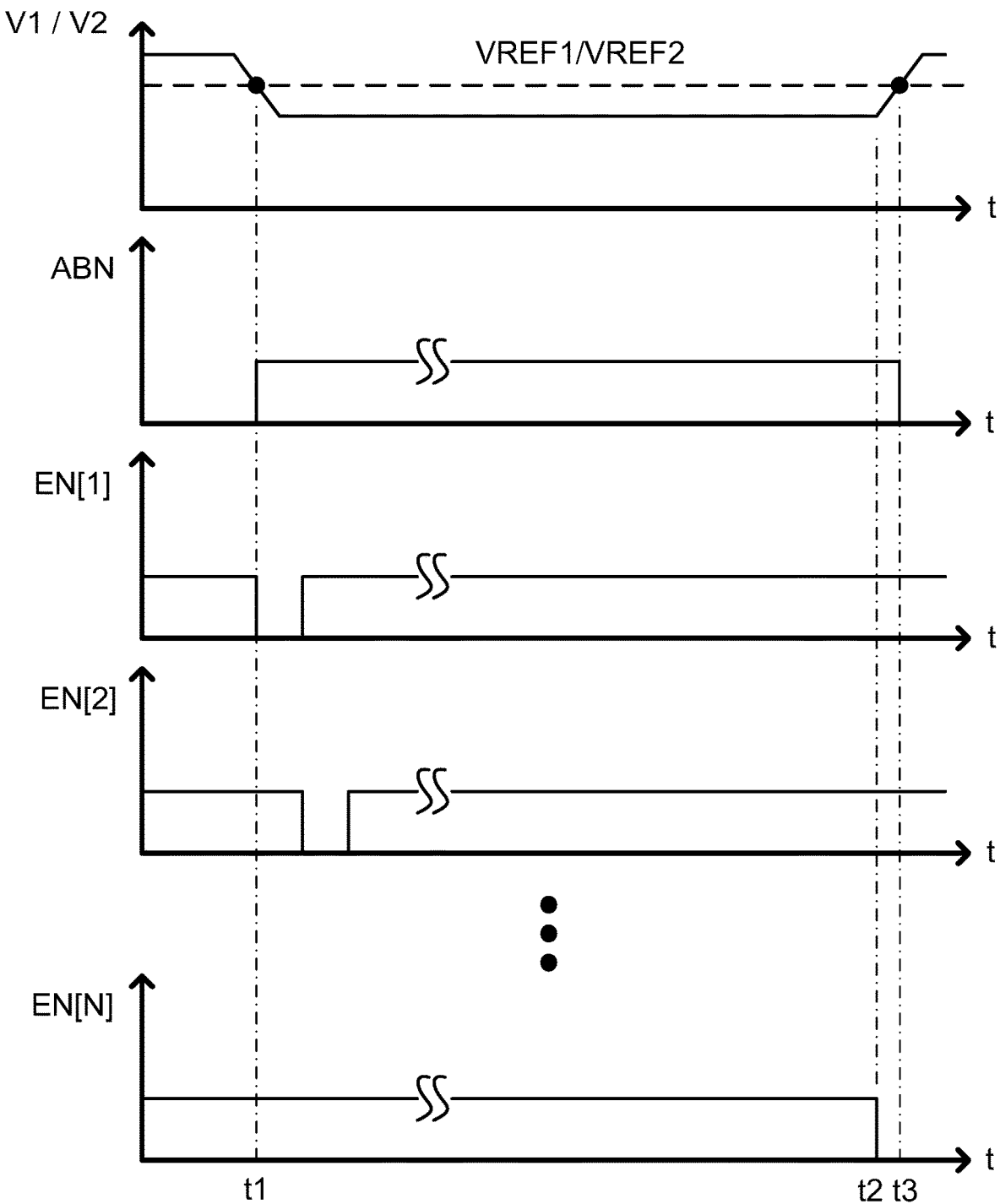
FIG. 4 shows a timing diagram of the detection circuit detecting the energy storage elements according to the first embodiment of the present invention.

Please refer to FIG. 4, which shows a timing diagram of the detection circuit detecting the energy storage elements according to the first embodiment of the present invention. As shown in the figure, at time t1, the power detection circuit 12 detects the voltage levels of the input power V1 and the output power V2 according to the first reference voltage VREF1. In other words, it detects whether the voltage levels of the input power V1 and the output power V2 are lower or higher than the voltage of the first reference voltage VREF1. Thereby, when the voltage levels of the input power V1 or the output power V2 is lower than the voltage level of the first reference voltage VREF1, the power detection circuit 12 generates a high-level detection signal ABN to the control circuit 14. The control circuit 14 generates low-level enable signals EN[1] and EN[2] sequentially to isolate the energy storage elements 30 of the first and second energy storage circuits SC[1]~SC[2] sequentially. Nonetheless, the voltage level of the input power V1 or the output power V2 is still maintained lower than the voltage level of the first reference voltage VREF1. It means that the energy storage elements 30 of the first and second energy storage circuits SC[1]~SC[2] are normal element without causing the states of the input power V1 or the output power V2 are abnormal power state. Assume that the energy storage element 30 of the N-th energy storage circuit SC[N] is abnormal element. Then, at time t2, the control circuit 14 generates a low-level enable signal EN[N]. After isolating the energy storage element 30 of the N-th energy storage circuit SC[N], at time t3, the power detection circuit 12 detects that the states of the input power V1 and the output power V2 are normal power state (higher than the voltage level of the first reference voltage VREF1). Besides, the times t1~t3 and the voltage variations plotted in FIG. 4 are used for illustration, not for limiting the present invention.

Figure 5:
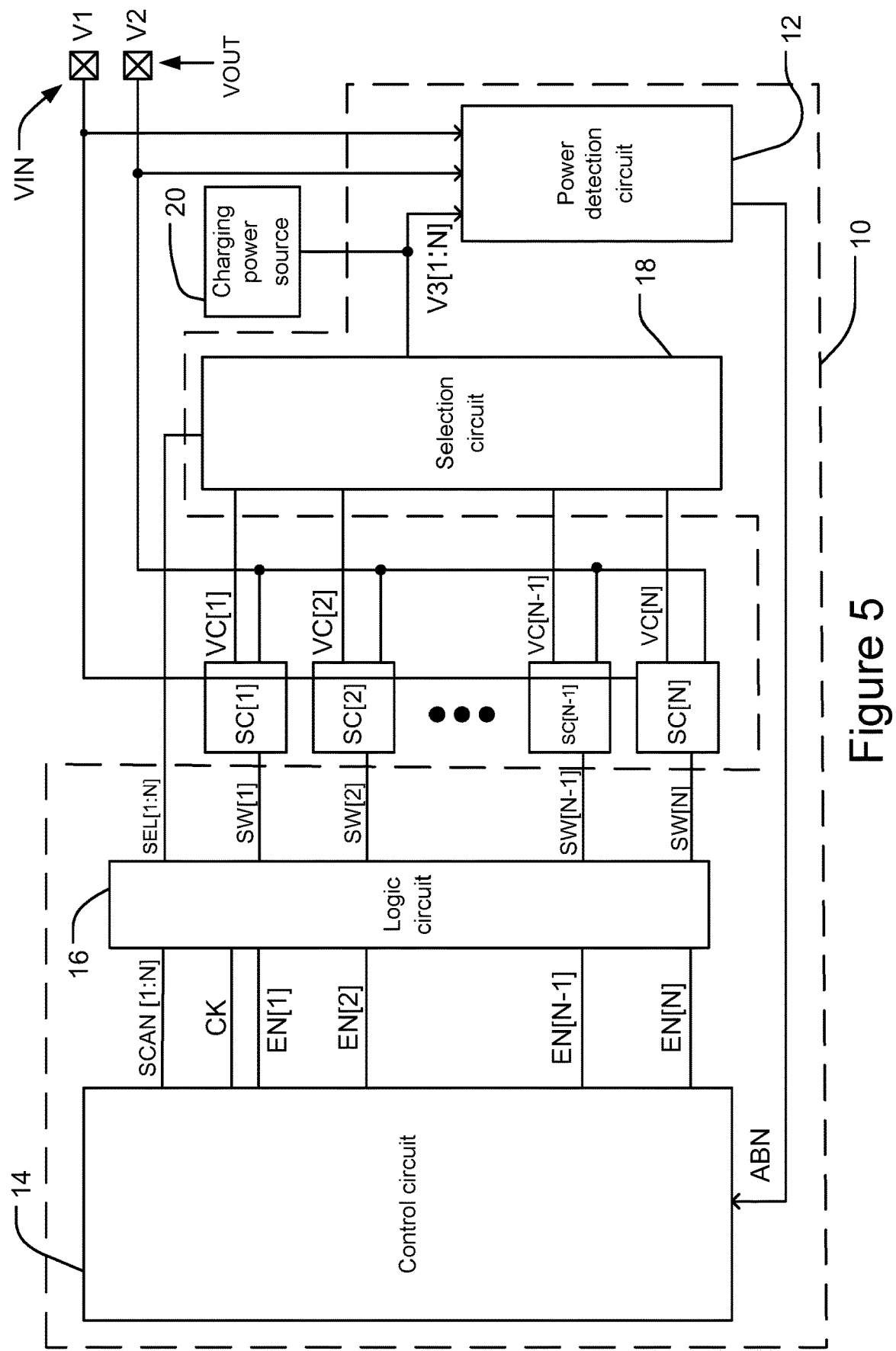
FIG. 5 shows a circuit diagram of the detection circuit of the power circuit according to the second embodiment of the present invention.

Please refer to FIG. 5, which shows a circuit diagram of the detection circuit of the power circuit according to the second embodiment of the present invention. As shown in the figure, the difference between the embodiment in FIG. 5 and the one in FIG. 1 is that the power circuit in FIG. 5 further comprises a selection circuit 18 and a charging power source 20. The selection circuit 18 may be a multiplexer. The abnormality detection circuit 10 may control (switch on or switch off) the path between one or more of the energy storage circuits SC[1:N] and the charging power source 20. The charging power source 20 charges the one or more energy storage circuit and generates a voltage under test V3. Thereby, the abnormality detection circuit 10 detects the voltage under test V3 for detecting if the one or more energy storage circuit may operate normally. Furthermore, in addition to generating the clock signal CK and the enable signals EN[1]~EN[N], the abnormality detection circuit 10 further generates a plurality of scan signals SCAN[1:N] and controls (switch on or switch off) the path between one or more energy storage circuit of the energy storage circuits SC[1:N] and the charging power source 20 according to the scan signals SCAN[1:N]. Besides, the control circuit 14 generates the scan signals SCAN[1:N] according to the detection signal ABN. Thereby, the control circuit 14 controls the path between one or more energy storage circuit and the charging power source 20 according to the detection signal ABN. Namely, it switches on the path between the one or more energy storage element 30 and the charging power source 20. Thereby, the charging power source 20 charges one or more energy storage element 30 for generating the voltage under test V3. The power detection circuit 12 is coupled to the voltage under test V3 and detects the voltage under test V3.

The selection circuit 18 is coupled to the energy storage circuits SC[1:N] and the charging power source 20. The control circuit 14 according to the detection signal ABN controls the selection circuit 18 via the logic circuit 16 to switch on the path between one or more of the energy storage circuits SC[1:N]. The energy storage elements 30 include a detection terminal VC[1], VC[2] . . . VC[N], VC[N−1], respectively, and are coupled to the selection circuit 18, such as a multiplexer, for performing detection, respectively. In other words, the abnormality detection circuit 10 uses the scan signals SCAN[1:N] to control the selection circuit 18 for switching on the paths between the energy storage elements 30 of each energy storage circuit SC[1:N] and the charging power source 20. By charging by the charging power source sequentially, the voltage under test V3 may be generated and thus detecting the energy storage elements 30 of each energy storage circuit SC[1:N] are normal or abnormal element. The energy storage elements 30 are charged sequentially by the charging power source 20. The charging power 20 may charge the energy storage elements 30 one, two, or multiple energy storage elements at a time. Namely, the embodiments in FIG. 1 and FIG. 5 do not limit the number for detecting the energy detection devices 30 at the same time.

The logic circuit 16 is coupled to the control circuit 14 and the selection circuit 18. The control circuit 14 generates the scan signals SCAN[1]~SCAN[N] according to the detection signal ABN. The logic circuit 16 generates one or more election signal SEL[1:N] according to the scan signals SCAN[1]~SCAN[N]. The selection circuit 18 controls the path between one or more energy storage element 30 and the charging power source 20 according to one or more election signal SEL[1:N]. For example, when the level of the first enable signal EN[1] is low, the level of the first scan signal SCAN[1] generated by the control circuit 14 is high and controlling the energy storage element 30 of the first energy storage circuit SC[1] to be charged by the charging power source 20. In addition, the first switching signal SW[1] switches off the path from the energy storage element 30 of the first energy storage circuit SC[1] to the input terminal VIN and the output terminal VOUT. In other words, the first scan signal SCAN[1] and the first enable signal EN[1] control the energy storage element 30 of the first energy storage circuit SC[1] to be detected. Thereby, in the detection time, the logic circuit 16 generates the first selection signal SEL[1] according to the scan signal SCAN[1] and the enable signal EN[1]. As described in the above embodiments, the waveform of the selection signal SEL may be identical to that of the scan signal SCAN[1]. Namely, the selection signal SEL is equivalent to, but not limited to, the scan signal SCAN[1]. The logic circuit 16 according to the present embodiment may be integrated in the control circuit 14. That is to say, the control circuit 14 may output the switching signals SW[1:N] and the selection signals SEL[1:N] directly.

Figure 9:
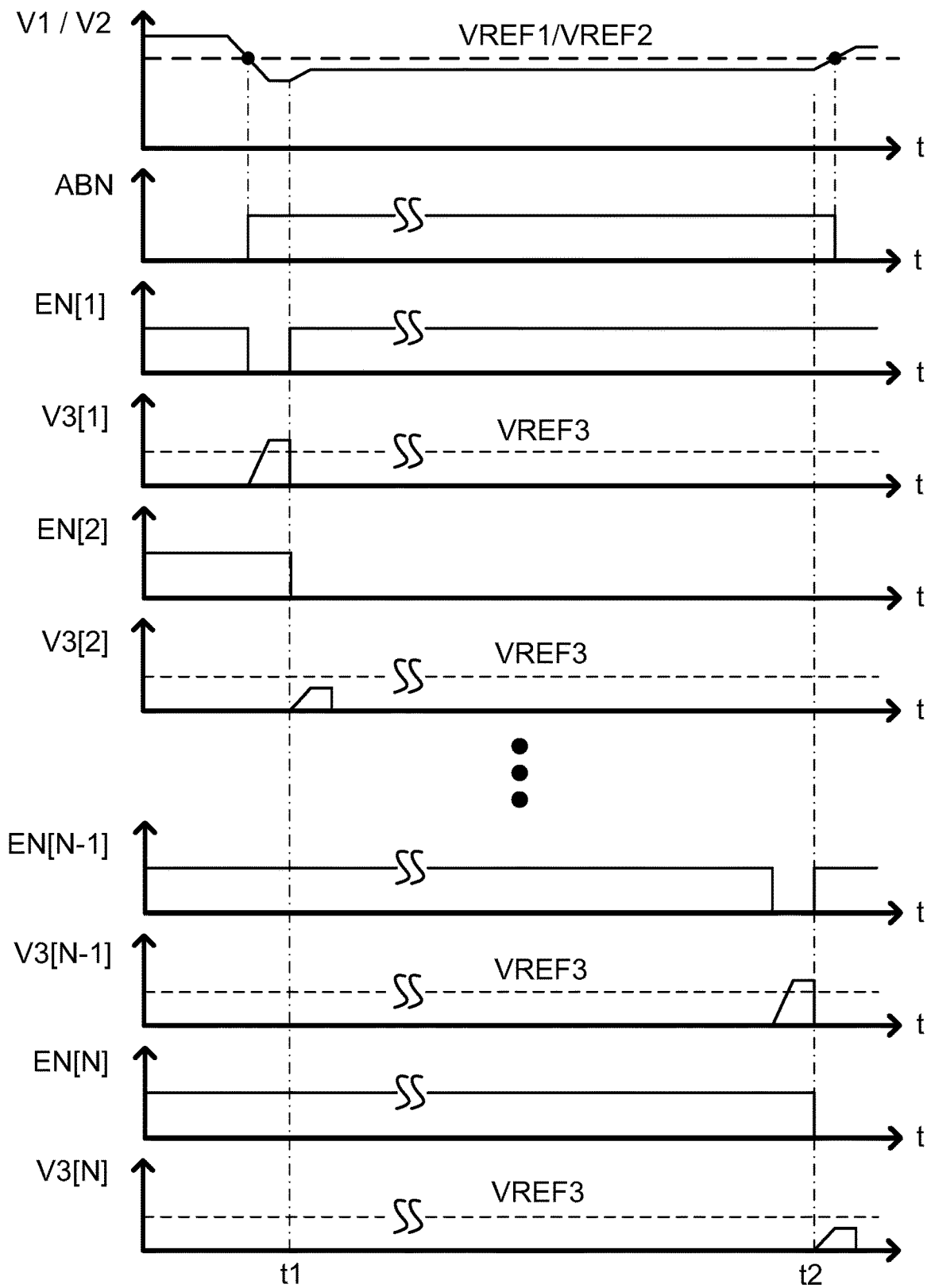
FIG. 9 shows a timing diagram of the detection circuit detecting the energy storage elements according to the second embodiment of the present invention.

The energy storage elements 30 of the energy storage circuits SC[1:N] are coupled to the charging power source 20 via the selection circuit 18, so that the charging power source 20 may charge the energy storage elements 30 and generate the voltage under test V3. When the abnormality detection circuit 10 detects the energy storage element 30 of the first energy storage circuit SC[1], the selection circuit 18 switches on the path between the detection terminal VC[1] of the energy storage element 30 of the first energy storage circuit SC[1] and the charging power source 20 for the charging power 20 to charge the energy storage element 30 of the first energy storage circuit SC[1] and generate the voltage under test V3. The selection circuit 18 is coupled to the power detection circuit 12, which detects if the voltage level of the voltage under test V3 is lower than the voltage level of a third reference voltage VREF3, as shown in FIG. 9. If so, it means that the energy storage elements 30 under detection is abnormal element; otherwise, the energy storage elements 30 under detection is normal element. When the abnormality detection circuit 10 detects the energy storage element 30 of the second energy storage circuit SC[2], the selection circuit 18 switches on the path between the detection terminal VC[2] of the energy storage element 30 of the second energy storage circuit SC[2] and the charging power source 20 for the charging power 20 to charge the energy storage element 30 of the second energy storage circuit SC[2] and generate the voltage under test V3. Then the power detection circuit 12 detects if the voltage level of the voltage under test V3 is lower than the voltage level of a third reference voltage VREF3. In other words, according to the embodiment in FIG. 1, the energy storage elements 30 are detected according to the input power V1 and the output power V2. According to the embodiment in FIG. 5, the charging power source 20 further charges the energy storage elements 30 and generates the voltage under test V3 for detecting the voltage level of the voltage under test V3 and further detecting the energy storage element 30 is normal or abnormal.

Moreover, as described above, when a portion of the energy storage circuits SC[1:N] are detected, in other words, when a portion of the energy storage elements 30 are coupled to the charging power source 20 instead of the input terminal VIN and the output terminal VOUT for detection, the power detection circuit 12 will detect if the states of the input power V1 and the output power V2 have recovered to normal power states. It also detects the voltage level of the voltage under test V3 for finding out the failed energy storage elements. The rest technical contents are identical to the description for the embodiment in FIG. 1. Hence, the details will not be described again.

Figure 6:
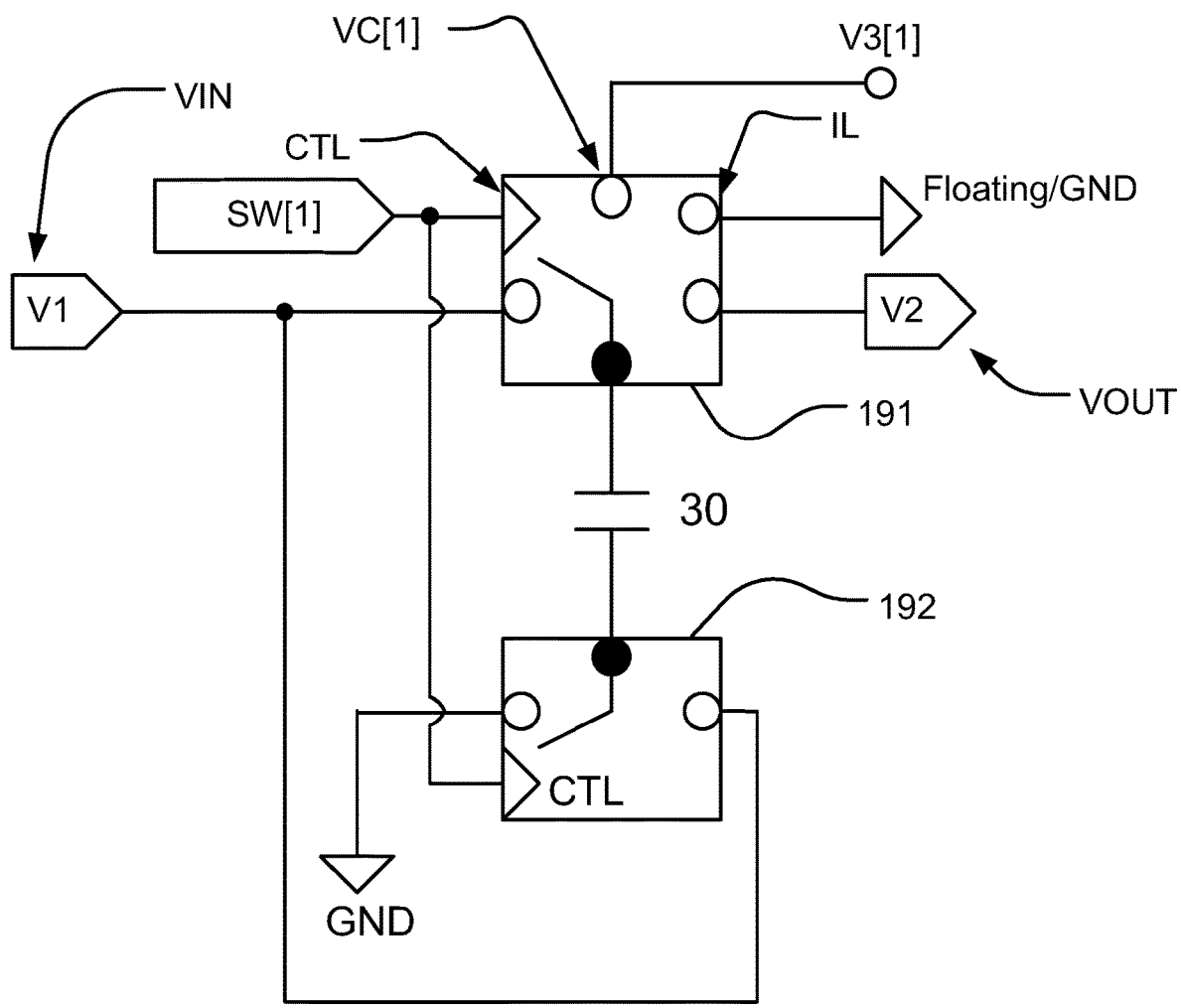
FIG. 6 shows a circuit diagram of the energy storage circuit according to the second embodiment of the present invention.

Please refer to FIG. 6, which shows a circuit diagram of the energy storage circuit according to the second embodiment of the present invention. The present embodiment uses the first energy storage circuit SC[1] as an example for explanation. As shown in the figure, the first energy storage circuit SC[1] may include a plurality of switching circuits 191, 192 and an energy storage element 30. In addition, the difference between the embodiment in FIG. 6 and the one in FIG. 2 is that the switching circuit 191 according to the embodiment in FIG. 6 includes four switching states. In addition to switching to coupling the first terminal of the energy storage element 30 to the input terminal VIN, the output terminal VOUT, or the isolation terminal IL, the first terminal of the energy storage element 30 may be further coupled to the detection terminal VC[1] for coupling to the charging power source 20. Thereby, the charging power source 20 may charge the energy storage element 30 for generating the voltage under test V3. The control terminal CTL of the switching circuit 191 receives the switching signal SW[1] for switching path according to the switching signal SW[1]. In other words, the selection circuit 18 shown in FIG. 5 has been integrated with the switching circuit 191 of the energy storage circuit SC[1] in FIG. 6. The path leads to the selection circuit 18 when the switching circuit 191 switches the first terminal of the energy storage element 30 to the detection terminal VC[1]. The logic circuit 16 generates the switching signal SW[1] according to the clock signal CK, the enable signal EN[1], and the scan signal SCAN[1]. The circuits and control of the rest energy storage circuits SC[2:N] are identical to the description for the first energy storage circuit SC[1]. Hence, the details will not be described again.

Figure 7:
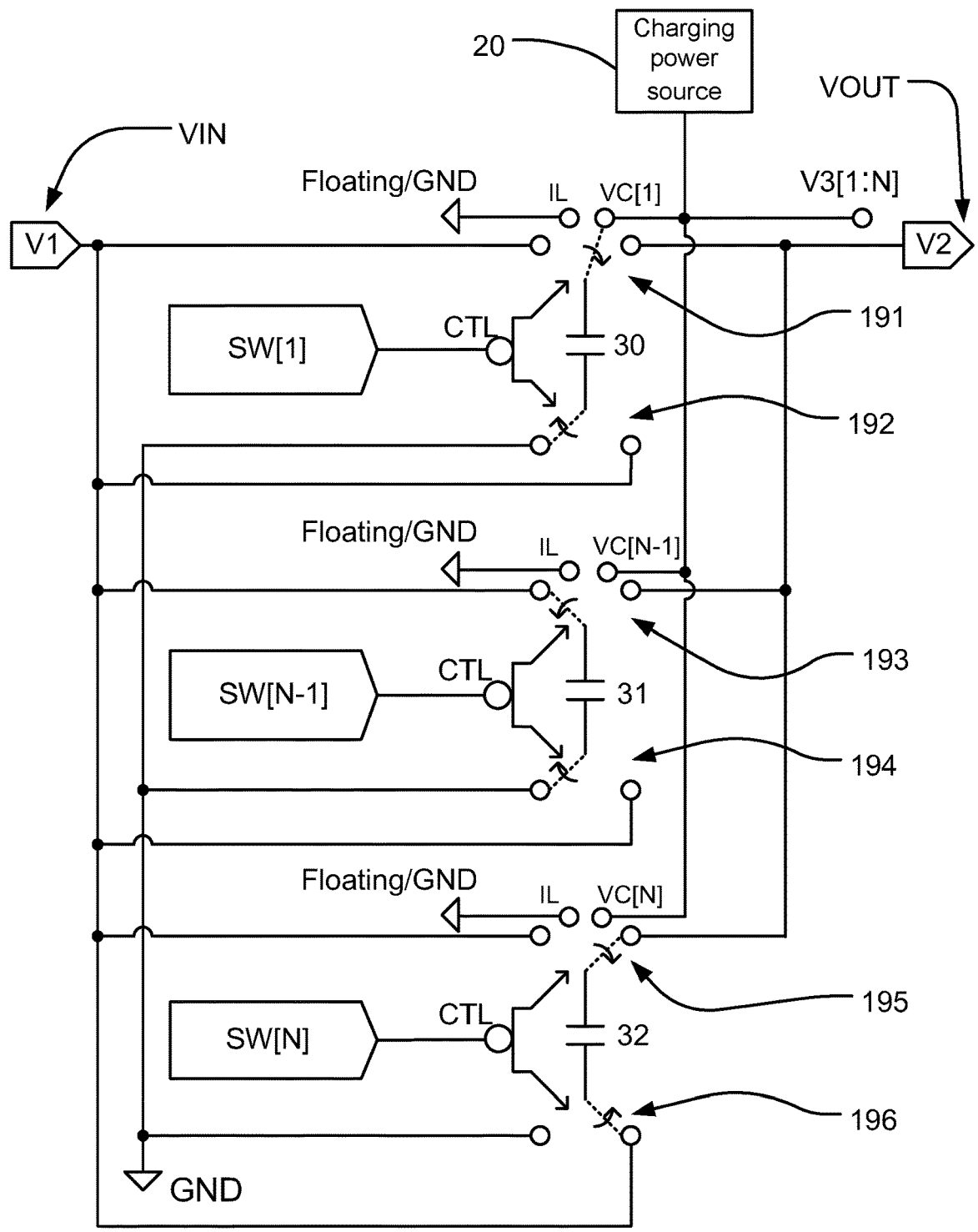
FIG. 7 shows a circuit diagram of the switching circuit according to the second embodiment of the present invention.

Please refer to FIG. 7, which shows a circuit diagram of the switching circuit according to the second embodiment of the present invention. As shown in the figure, the switching circuits 191, 192, 193, 194, 195, 196 may be switches for selectively coupling the energy storage elements 30 between the input terminal VIN and the reference terminal GND, or between the output terminal VOUT and the input terminal VIN, or between the charging power source 20 and the reference terminal GND, for performing charging, discharging, or detection operations. In addition, if the energy storage element 30 is detected abnormal, the switching circuits may switch paths for coupling the energy storage elements 30 between the isolation terminal IL and the reference terminal GND for isolation of the energy storage elements 30.

Figure 8:
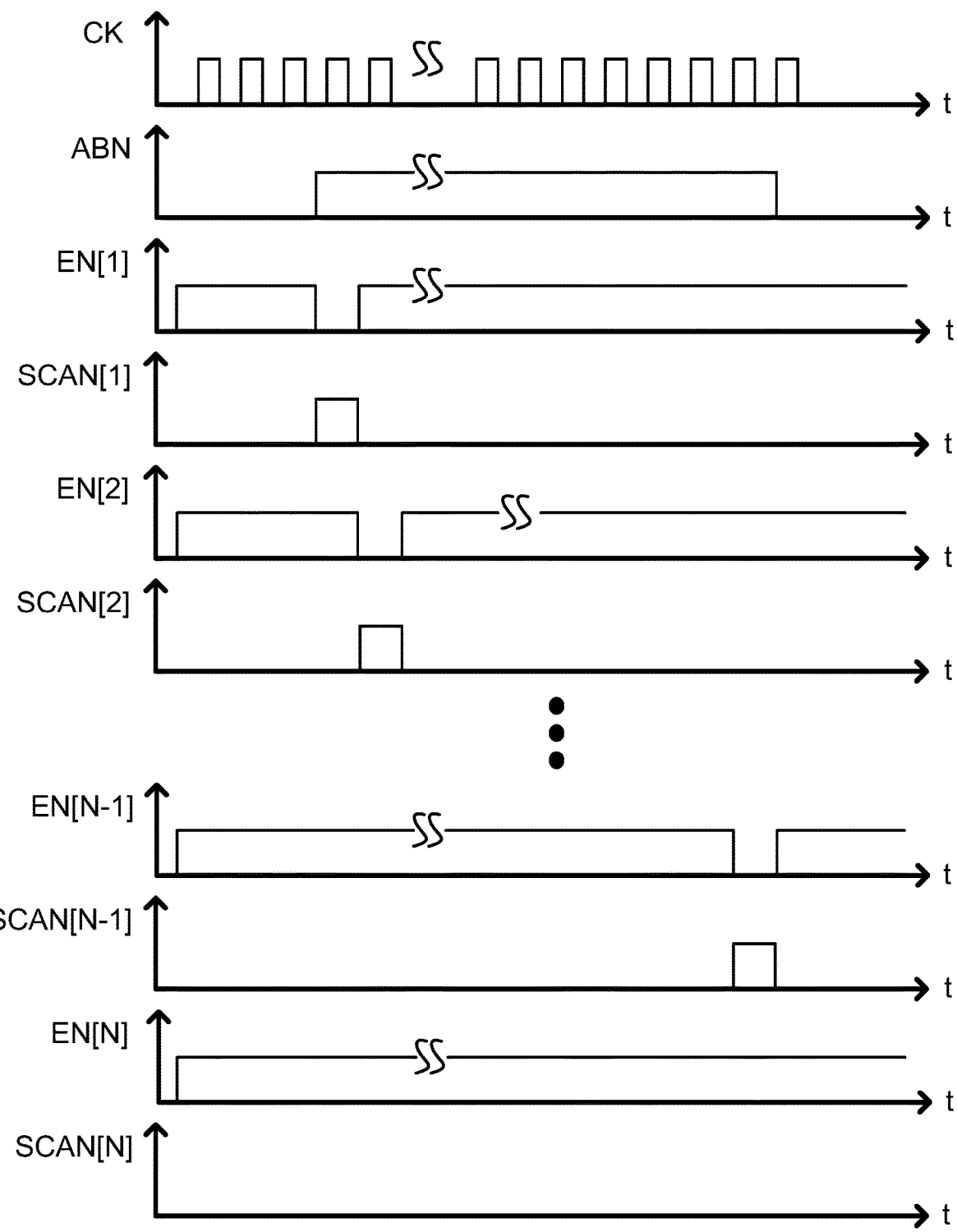
FIG. 8 shows a timing diagram of the scanning signal scanning the energy storage elements according to an embodiment of the present invention.

Please refer to FIG. 8, which shows a timing diagram of the scanning signal scanning the energy storage elements according an embodiment of the present invention. As shown in the figure, when the level of the detection signal ABN is high, the enable signals EN[1]~EN[N−1] may change from high level to low level sequentially and hold for a period for detection. Thereby, the scan signals SCAN[1] ~SCAN[N−1] are high sequentially and held for a period for scanning sequentially the energy storage elements 30 of the energy storage circuits SC[1:N], so that the charging power source 20 may charge the energy storage elements 30 for generating the voltage under test V3. When the level of the detection signal ABN is low, the detection is completed. As shown in the figure, the level of the enable signal EN[N] will not change from high level to low level. According to the embodiment in FIG. 8, before detecting the energy storage element 30 of the N-th energy storage circuit SC[N], the states of the input power V1 and the output power V2 have recovered to normal power states. Thereby, the abnormality detection circuit 10 stops detection. It is not necessary to detect the energy storage element 30 of the N-th energy storage circuit SC[N].

Please refer to FIG. 9, which shows a timing diagram of the detection circuit detecting the energy storage elements according to the second embodiment of the present invention. As shown in the figure, as the voltage levels of the input power V1 and the output power V2 are lower than the voltage level of the first reference voltage VREF1, the power detection circuit 12 outputs the high-level detection signal ABN for starting detection. When the voltage level of the voltage under test V3 is higher than the voltage level of the third reference voltage VREF3, for example, the voltages under test V3[1], V3[N−1] generated by the energy storage elements 30 of the first and the (N−1)-th energy storage circuits SC[1], SC[N−1], it means that the energy storage elements 30 are normal elements. When the voltage level of the voltage under test V3 is lower than the voltage level of the third reference voltage VREF3, for example, the voltages under test V3[2], V3[N] generated by the energy storage elements 30 of the second and the N-th energy storage circuits SC[2], SC[N], it means that the energy storage elements 30 are abnormal elements. Since the energy storage elements 30 of the second and the N-th energy storage circuits SC[2], SC[N] are abnormal elements, the levels of the enable signals EN[2], EN[N] are held low for controlling the switching circuits of the second energy storage circuit SC[2] and the N-th energy storage circuit SC[N] to switch paths for isolating the energy storage elements 30. Thereby, the voltage levels of the input power V1 and the output voltage V2 will not be pulled low by the energy storage elements 30 of the second energy storage circuit SC[2] and the N-th energy storage circuit SC[N]. Once the voltage levels of the input power V1 and the output voltage V2 are pulled low, the abnormal power states will occur.

Furthermore, since there are two failed energy storage elements 30 among the energy storage elements 30 according to the embodiment in FIG. 9, when the first failed energy storage element 30 (the energy storage element 30 of the second energy storage circuit SC[2] according to the embodiment in FIG. 9) is under detection and not coupled to the input terminal VIN and the output terminal VOUT, the voltage levels of the input power V1 or the output power V2 are increased slightly at time t1 but still not exceeding the voltage level of the first reference voltage VREF1. Next, when the last failed energy storage element 30 (the energy storage element 30 of the N-th energy storage circuit SC[N] according to the embodiment in FIG. 9) is under detection and not coupled to the input terminal VIN and the output terminal VOUT, since there is no other failed energy storage element 30 that could influence the voltage level of the input power V1 and the output power V2, the voltage levels of the input power V1 and the output power V2 start to increase gradually at time t2 and exceed the voltage level of the first reference voltage VREF1, and thus changing to the normal power state.

Figure 10:
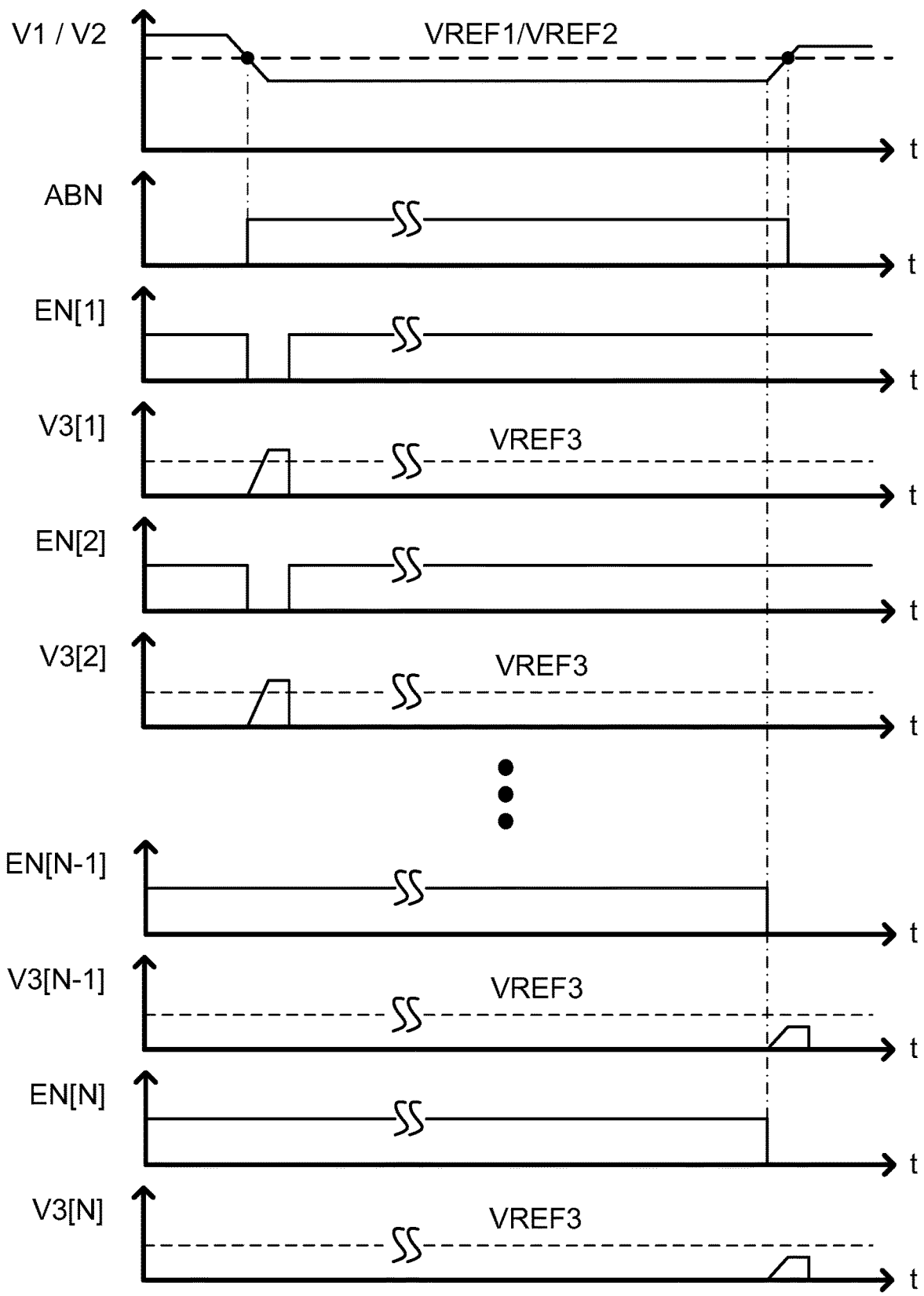
FIG. 10 shows a timing diagram of the detection circuit detecting the energy storage elements according to the third embodiment of the present invention.

Please refer to FIG. 10, which shows a timing diagram of the detection circuit detecting the energy storage elements according to the third embodiment of the present invention. As shown in the figure, the abnormality detection circuit 10 according to the embodiment in FIG. 10 may detect the energy storage elements of two energy storage circuits being normal or abnormal concurrently, such as the energy storage elements 30 in the first and second energy storage circuits SC[1], SC[2], or the energy storage elements 30 in the (N−1)-th and N-th energy storage circuits SC[N−1], SC[N]. Namely, the abnormality detection circuit 10 controls the switching circuits of two energy storage circuits for coupling the energy storage elements 30 of the two energy storage circuits to the charging power source 20 concurrently and enabling the charging power source 20 to charge the energy storage elements 30 of the two energy storage circuits concurrently. According to the figure, the energy storage elements 30 of the first energy storage circuit SC[1] and the second energy storage circuit SC[2] are normal elements; the energy storage elements 30 of the (N−1)-th energy storage circuit SC[N−1] and the N-th energy storage circuit SC[N] are abnormal elements. Besides, according to different embodiments, the abnormality detection circuit 10 may control the energy storage element 30 of a single energy storage circuit to couple to the charging power source 20. That is to say, the charging power source 20 does not charge the energy storage elements 30 of multiple energy storage circuits concurrently. For example, it does not detect the energy storage elements 30 of the (N−1)-th energy storage circuit SC[N−1] and the energy storage element 30 of the N-th energy storage circuit SC[N] being normal or abnormal concurrently.

To sum up, the present invention relates to a detection circuit of a power circuit. The detection circuit includes an abnormality detection circuit. The abnormality detection circuit is coupled to an input terminal or/and an output terminal of the power circuit. An input power is provided to the input terminal, and an output power is provided to the output terminal. The abnormality detection circuit controls the paths from a plurality of energy storage elements to the input terminal and output terminal of the power circuit. The energy storage elements store the energy of the input power to generate the output power. The abnormality detection circuit detects the state of the input power or/and the output power, and cuts off the paths from a portion of the energy storage elements to the input terminal and the output terminal. In addition, the abnormality detection circuit may switch off and switch on the paths from the energy storage elements to the input terminal and the output terminal.

The present invention relates to a power circuit, which comprises a plurality of energy storage elements, a plurality of switching circuits, and an abnormality detection circuit. The energy storage elements store the energy of an input power for generating the output power. The switching circuits are coupled to the energy storage elements, an input terminal, an output terminal, and an isolation terminal. The input power is supplied to the input terminal; the output power is supplied to the output terminal. The switching circuits switch the paths from the energy storage elements to the input terminal, the output terminal, and the isolation terminal. The abnormality detection circuit detects the state of the input power or/and the output power, and controls the switching circuits to switch the paths from the energy storage elements to the input terminal, the output terminal, and the isolation terminal.

According to the above description, the present invention may detect if the energy storage elements of a power circuit are normal or abnormal.

The invention claimed is:

1. A detection circuit of power circuit, comprising:
an abnormality detection circuit coupled to an input terminal or/and an output terminal of said power circuit, an input power supplied to said input terminal, an output power supplied to said output terminal, said abnormality detection circuit controlling a plurality of paths from a plurality of energy storage elements of said power circuit to said input terminal, said output terminal and an isolation terminal, said energy storage elements storing the energy of said input power for generating said output power, and said abnormality detection circuit detecting a state of said input power or/and said output power and switching off said path from a portion of said energy storage elements to said input terminal and said output terminal and switching on said path from said portion of said energy storage elements to said isolation terminal.

2. The detection circuit of power circuit of claim 1, wherein said abnormality detection circuit controls said path between one or more of said energy storage elements and a charging power source; said charging power source charges said one or more energy storage elements to generate a voltage under test; and said abnormality detection circuit detects said voltage under test.

3. The detection circuit of power circuit of claim 1, wherein said abnormality detection circuit comprises:
a power detection circuit coupled to said input terminal or/and said output terminal, detecting a voltage level of said input power or/and said output power, and generating a detection signal; and
a control circuit coupled to said power detection circuit, and switching off said path from said portion of said energy storage elements to said input terminal and said output terminal.

4. The detection circuit of power circuit of claim 3, wherein when said power detection circuit detects a voltage level of said input power, said control circuit switches off said path between one or more of said energy storage elements and said input terminal according to said detection signal.

5. The detection circuit of power circuit of claim 3, wherein when said power detection circuit detects a voltage level of said output power, said control circuit switches off said path between one or more of said energy storage elements and said output terminal according to said detection signal.

6. The detection circuit of power circuit of claim 3, wherein when said power detection circuit detects a plurality of voltage levels of said input power and said output power, said control circuit switches off said paths from one or more of energy storage elements to said input terminal and said output terminal according to said detection signal.

7. The detection circuit of power circuit of claim 3, wherein said abnormality detection circuit comprises a logic circuit coupled to said control circuit; said control circuit generates a plurality of enable signals according to said detection signal; and said logic circuit switches off said paths from said portion of energy storage elements to said input terminal and said output terminal according to said enable signals.

8. The detection circuit of power circuit of claim 3, wherein said control circuit controls said path between one or more of said energy storage elements and a charging power source according to said detection signal; said charging power source charges said one or more energy storage element to generate a voltage under test; and said power detection circuit detects said voltage under test.

9. The detection circuit of power circuit of claim 8, wherein said abnormality detection circuit comprises a selection circuit coupled to said energy storage elements and said charging power source; and said control circuit controls said selection circuit according to said detection signal to switch on said path between said one or more energy storage element and said charging power source.

10. The detection circuit of power circuit of claim 9, wherein said abnormality detection circuit comprises a logic circuit coupled to said control circuit and said selection circuit; said control circuit generates a plurality of scan signals according to said detection signal; said logic circuit generates one or more selection signal according to said scan signals; and said selection circuit controls said path between said one or more energy storage element and said charging power source according to said selection signal.

11. The detection circuit of power circuit of claim 1, further comprising a plurality of switching circuits coupled to said abnormality detection circuit, said energy storage elements, said input terminal, and said output terminal, wherein said abnormality detection circuit controls said switching circuits for switching said path from said energy storage elements to said input terminal or/and said output terminal.

12. A detection circuit of power circuit, comprising:
an abnormality detection circuit coupled to an input terminal or/and an output terminal of said power circuit, an input power supplied to said input terminal, an output power supplied to said output terminal, said abnormality detection circuit controlling a plurality of paths from a plurality of energy storage elements of said power circuit to said input terminal, said output terminal and an isolation terminal, said energy storage elements storing the energy of said input power for generating said output power, and said abnormality detection circuit detecting the states of said input power or/and said output power and switching off or switching on said paths from said energy storage elements to said input terminal, said output terminal and said isolation terminal.

13. The detection circuit of power circuit of claim 12, wherein said abnormality detection circuit controls said paths between said energy storage elements and a charging power source; said charging power source charges said energy storage elements to generate a plurality of voltages under test; and said abnormality detection circuit detects said voltages under test.

14. The detection circuit of power circuit of claim 12, wherein said abnormality detection circuit comprises:
a power detection circuit coupled to said input terminal or/and said output terminal, detecting a voltage level of said input power or/and said output power, and generating a detection signal; and
a control circuit coupled to said power detection circuit, switching off and switching on said paths from said energy storage elements to said input terminal or said output terminal according to said detection signal.

15. The detection circuit of power circuit of claim 14, wherein said abnormality detection circuit comprises:
a logic circuit coupled to said control circuit; in which said control circuit generates a plurality of enable signals according to said detection signal; and said logic circuit switches off and switches on said paths from said energy storage elements to said input terminal or said output terminal according to said enable signals.

16. The detection circuit of power circuit of claim 14, wherein said control circuit controls a plurality of paths between said energy storage elements and a charging power source according to said detection signal; said charging power source charges said energy storage elements to generate a plurality of voltages under test; and said power detection circuit detects said voltages under test.

17. The detection circuit of power circuit of claim 16, wherein said abnormality detection circuit comprises:
a selection circuit coupled to said energy storage elements and said charging power source; and said control circuit controls said selection circuit according to said detection signal to switch on said paths between said energy storage elements and said charging power source.

18. The detection circuit of power circuit of claim 17, wherein said abnormality detection circuit comprises:
a logic circuit coupled to said control circuit and said selection circuit; in which said control circuit generates a plurality of scan signals according to said detection signal; said logic circuit generates one or more selection signal according to said scan signals; and said selection circuit controls said paths between said energy storage elements and said charging power source according to said selection signal.

19. The detection circuit of power circuit of claim 12, further comprising:
a plurality of switching circuits coupled to said abnormality detection circuit, said energy storage elements, said input terminal, and said output terminal, and said abnormality detection circuit controlling said switching circuits for switching said paths from said energy storage elements to said input terminal and said output terminal.

20. A power circuit, comprising:
a plurality of energy storage elements storing the energy of an input power for generating an output power;
a plurality of switching circuits coupled to said energy storage elements, an input terminal, an output terminal, and an isolation terminal, said input power supplied to said input terminal, said output power supplied to said output terminal, said switching circuits switching a plurality of paths from said energy storage elements to said input terminal, said output terminal, and said isolation terminal; and
an abnormal detection circuit detecting a state of said input power or/and said output power, and controlling said switching circuits to switch said paths from said energy storage elements to said input terminal, said output terminal, and said isolation terminal.

21. The power circuit of claim 20, wherein said isolation terminal is in a floating state.

22. The power circuit of claim 20, wherein said isolation terminal is a reference terminal.

23. The power circuit of claim 20, wherein said abnormality detection circuit controls a portion of said switching circuits to switch off said paths from a portion of said energy storage elements to said input terminal and said output terminal and to switch on said paths from said portion of energy storage elements to said isolation terminal.

24. The power circuit of claim 20, wherein said abnormality detection circuit controls a path between one or more of said energy storage elements and a charging power source; said charging power source charges said one or more energy storage element to generate a voltage under test; and said abnormality detection circuit detects said voltage under test.

25. The power circuit of claim 20, wherein said abnormality detection circuit comprises:
a power detection circuit coupled to said input terminal or/and said output terminal, detecting a voltage level of said input power or/and said output power, and generating a detection signal; and
a control circuit coupled to said power detection circuit, and controlling said switching circuits according to said detection signal to switch said paths from said energy storage elements to said input terminal, said output terminal, and said isolation terminal.

26. The power circuit of claim 25, wherein when said power detection circuit detects a voltage level of said input power, said control circuit controls one or more of said switching circuits to switch off said path between one or more of said energy storage elements and said input terminal according to said detection signal.

27. The power circuit of claim 25, wherein when said power detection circuit detects a voltage level of said output power, said control circuit controls one or more of said switching circuits to switch off said path between one or more of said energy storage elements and said output terminal according to said detection signal.

28. The power circuit of claim 25, wherein when said power detection circuit detects a plurality of voltage levels of said input power and said output power, said control circuit controls one or more of said switching circuits to switch off said paths from one or more of said energy storage elements to said input terminal and said output terminal according to said detection signal.

29. The power circuit of claim 25, wherein said control circuit controls a portion of said switching circuits according to said detection signal to switch off said paths from a portion of said energy storage elements to said input terminal and said output terminal and to switch on said paths from said portion of energy storage elements to said isolation terminal.

30. The power circuit of claim 25, wherein said abnormality detection circuit comprises:
a logic circuit coupled to said control circuit; in which said control circuit generates a plurality of enable signals according to said detection signal; and said logic circuit controls said switching circuits to switch said paths from said energy storage elements to said input terminal, said output terminal, and said isolation terminal according to said enable signals.

31. The power circuit of claim 25, wherein said control circuit controls a path between one or more of said energy storage elements and a charging power source according to said detection signal; said charging power source charges said one or more energy storage element to generate a voltage under test; and said power detection circuit detects said voltage under test.

32. The power circuit of claim 31, wherein said abnormality detection circuit comprises:
a selection circuit coupled to said energy storage elements and said charging power source; and said control circuit controlling said selection circuit according to said detection signal to switch on said path between said one or more energy storage element and said charging power source.

33. The power circuit of claim 32, wherein said abnormality detection circuit comprises:
   a logic circuit coupled to said control circuit and said selection circuit; in which said control circuit generates a plurality of scan signals according to said detection signal; said logic circuit generates one or more selection signal according to said scan signals; and said selection circuit controls said path between said one or more energy storage element and said charging power source according to said selection signal.

* * * * *